United States Patent [19]

Harwood

[11] 4,302,792
[45] Nov. 24, 1981

[54] TRANSISTOR PROTECTION CIRCUIT

[75] Inventor: Leopold A. Harwood, Bridgewater, N.J.

[73] Assignee: RCA Corporation, New York, N.Y.

[21] Appl. No.: 163,149

[22] Filed: Jun. 26, 1980

[51] Int. Cl.³ ............................................. H02H 3/24
[52] U.S. Cl. ................................. 361/92; 330/207 P; 330/298; 361/56; 361/90; 361/91
[58] Field of Search ...................... 361/91, 92, 90, 13, 361/54, 101, 98, 56; 330/207 P, 298; 307/200 A, 253, 300

[56] References Cited

U.S. PATENT DOCUMENTS

| 3,819,952 | 6/1974 | Enomoto et al. | 361/56 |
| 4,106,048 | 8/1978 | Khatezadeh | 361/91 X |
| 4,133,000 | 1/1979 | Greenstein | 357/46 |

Primary Examiner—J. D. Miller
Assistant Examiner—Reinhard J. Eisenzopf
Attorney, Agent, or Firm—Eugene M. Whitacre; Paul J. Rasmussen; Ronald H. Kurdyla

[57] ABSTRACT

A circuit is described for protecting a semiconductor junction device such as a transistor against damage from high voltage transients that can be produced by kinescope arcing in a television receiver. The protected device is coupled to a circuit point at which the transients can appear. The protection circuit comprises a normally nonconductive protection transistor with a collector coupled to a source of operating potential, a base coupled to a source of threshold conduction bias reference voltage, and an emitter connected to the circuit point at which high voltage transients are likely to appear. The base bias of the protection transistor is determinable independent of the bias of the protected device, and the protection circuit is connected to the protected device with substantially zero voltage offset between the circuit point and the protected device. The protection transistor conducts in response to transient voltages appearing at the circuit point above a threshold level, and provides a path for safely diverting potentially destructive transient current away from the protected device.

11 Claims, 6 Drawing Figures

TRANSISTOR PROTECTION CIRCUIT

This invention concerns a circuit for protecting a semiconductor junction device from damage due to electrical stress caused by high voltage transients.

High voltage transients capable of damaging a semiconductor junction device such as a transistor can be developed in various ways. In a television receiver including an image producing kinescope, for example, such transients can be produced when high voltage kinescope arcing occurs. The transients can be of a magnitude, polarity and duration sufficient to damage or destroy transistors included in signal processing circuits of the receiver such as by exceeding the reverse breakdown voltage of the transistors and causing excessively high levels of reverse junction currents to flow. This effect is typically observed when high voltage transients are induced at circuit points or terminals to which the transistors are connected, and is particularly troublesome in a system comprising one or more integrated circuits containing sensitive, low level signal processing transistor circuits. In thecase of a bipolar transistor, excessive reverse base-emitter junction currents can destroy the transistor, or can cause the current gain characteristic of the transistor to be permanently degraded.

Various protection arrangements can be utilized to suppress the effects of high voltage transients.

Suitably poled semiconductor diodes can be employed at circuit points for bypassing transients away from sensitive transistor circuits to be protected. Diodes fabricated with non-standard techniques or configurations may be required for this purpose. Diodes with these requirements are often undesirable, particularly in an integrated circuit environment, since these requirements complicate the process of integrated circuit manufacture. In any case, care must be taken to ensure that the diodes have sufficient power dissipation capability to withstand the electrical stress associated with the transients without being destroyed, and that such diodes alone or together with any associated threshold level determining bias networks do not impair the desired impedance characteristics or high frequency response of signal circuits to be protected.

Resistors or impedance devices particularly designed to suppress high voltage transients also can be used. However, such devices may be too costly or otherwise impractical from a design standpoint in many circuit applications, and may impair the impedance characteristics and high frequency response of signal processing circuits with which they are used.

An active transistor protection circuit also has been used in combination with a sensing impedance, coupled to a circuit point at which high voltage transients may appear and to the circuit to be protected. With this arrangement the protection transistor serves to divert transient induced currents away from the circuit to be protected, when the protection transistor is activated in response to a threshold conduction voltage developed across the sensing impedance. This arrangement is undesirable when used to protect a signal processing circuit since the sensing impedance alters the impedance otherwise associated with the protected signal processing circuit, and can also attenuate high frequency signals normally appearing at the terminal by forming a low pass filter together with any parasitic capacitance that may appear at the terminal.

A transient protection circuit arranged according to the present invention avoids the disadvantages mentioned above and is particularly suitable for fabrication in an integrated circuit that also contains the circuit to be protected. Specifically, the protection circuit described herein requires a minimum of components and does not adversely affect the high frequency response or impedance characteristics of the protected circuit.

An arrangement according to the present invention protects a semiconductor device from electrical stress damage due to spurious high voltage transients. The semiconductor device comprises a semiconductor junction coupled to a circuit point at which the transients may appear and susceptible of damage from electrical stress when the transients exceed a given level. The protecting arrangement comprises a protection transistor with a collector electrode coupled to an operating potential, a base electrode, and an emitter electrode coupled to the circuit point. A reference bias voltage is applied to the base electrode in such manner that the bias of the base electrode is deteminable independent of the bias of the semiconductor device and the bias at the circuit point. The reference voltage is operative to reverse bias the collector-base junction of the protection transistor, and to reverse bias the base-emitter junction of the protection transistor in the absence of the transients so as to render the protection transistor normally nonconductive. The level of the reference bias voltage is such that the base-emitter junction of the protection transistor is forward biased in response to transients exceeding a threshold level below the given level, to permit conduction in the collector-emitter path of the protection transistor to divert transient currents away from the semiconductor device.

In accordance with a feature of the invention, the emitter of the protection transistor is connected to the semiconductor device with substantially zero offset voltage between the circuit point and the semiconductor device.

In accordance with a further feature of the invention, the protected semiconductor device comprises a bipolar transistor, similar to the protection transistor, protected against conducting excessive reverse input junction currents.

Figure 1:
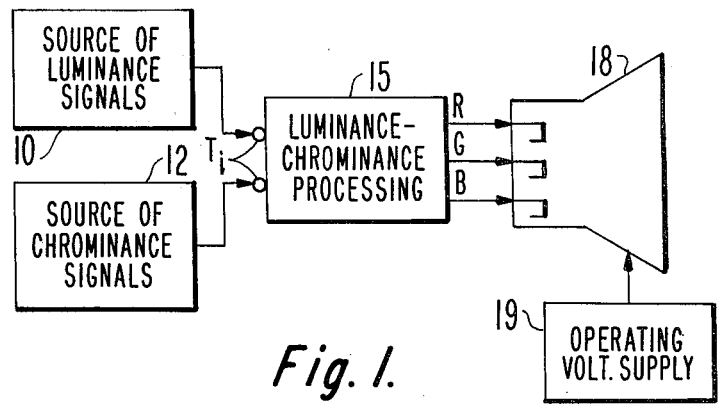
FIG. 1 shows a portion of a television receiver including a network incorporating a protection circuit according to the present invention.

In FIG. 1, luminance signals from a source 10 and chrominance signals from a source 12 are supplied to separate signal input terminals $T_i$ of a luminance and chrominance signal processor 15 included in a color television receiver. Processor 15 (e.g., an integrated circui) develops R, G, and B color image signals in response to the input luminance and chrominance signals as known. The color signals are supplied via a video output stage (not shown) to separate intensity control cathode electrodes of a color kinescope 18. An operating voltage supply 19 develops plural operating voltages for kinescope 18. These voltages include a high voltage on the order of 25,000 volts for biasing the anode electrode of kinescope 18, and voltages on the order of a few hundred volts for biasing other electrodes of kinescope 18 (e.g., cathode, screen grid and focus electrodes).

Processor 15 includes input circuits, coupled to input terminals $T_i$, that can be damaged or destroyed when high voltages are caused to be developed on the terminals of processor 15. In a television receiver, the primary source of such high voltages are transients caused by arcing of the kinescope. Kinescope arcing can occur between the high voltage anode electrode and the receiver chassis when the receiver is being serviced, for example. Kinescope arcing also can occur unpredictably between the anode and one or more of the other (lower potential) electrodes of the kinescope when the receiver is in normal operation. In any case, kinescope arcing results in a high voltage transient that is oscillatory in nature with positive and negative voltage peaks often in excess of one hundred volts at the circuit terminals and exhibiting a duration of from one to several microseconds.

Figure 2:
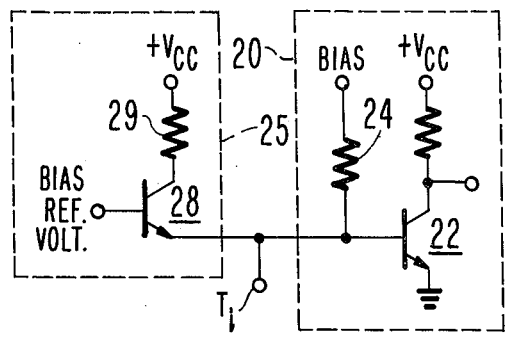
FIGS. 2-5 show circuit embodiments of protection circuits according to the present invention together with circuits to be protected.

A circuit for protecting circuits within processor 15 (FIG. 1) from damage due to high voltage transients is shown in FIG. 2.

FIG. 2 shows a signal processing circuit 20 including an NPN small signal amplifier transistor 22 and an associated based bias resistor 24. Input signals to be amplified are coupled to the base electrode of transistor 22 via a terminal $T_i$. Amplified signals appear at a collector output of transistor 22, from where they are applied to following signal translating stages (not shown).

The arrangement of FIG. 2 also includes a protection circuit 25 comprising an NPN transistor 28 with an emitter electrode connected directly to terminal $T_i$, a base electrode coupled to a bias reference voltage (e.g., ground potential), and a collector electrode coupled to a positive operating supply voltage $+V_{cc}$. In this example, transistor 28 is similar to transistor 22. A resistor 29 in the collector circuit of transistor 28 is a symbolic representation of the distributed collector area resistance of transistor 28. Transistor 28 is normally non-conducting and in this example does not function as a signal processing device and is not included in a signal processing path. Circuits 20 and 25 can readily be fabricated in common in a single integrated circuit, in which case terminal $T_i$ corresponds to an external connecting terminal of the integrated circuit.

Figure 6:
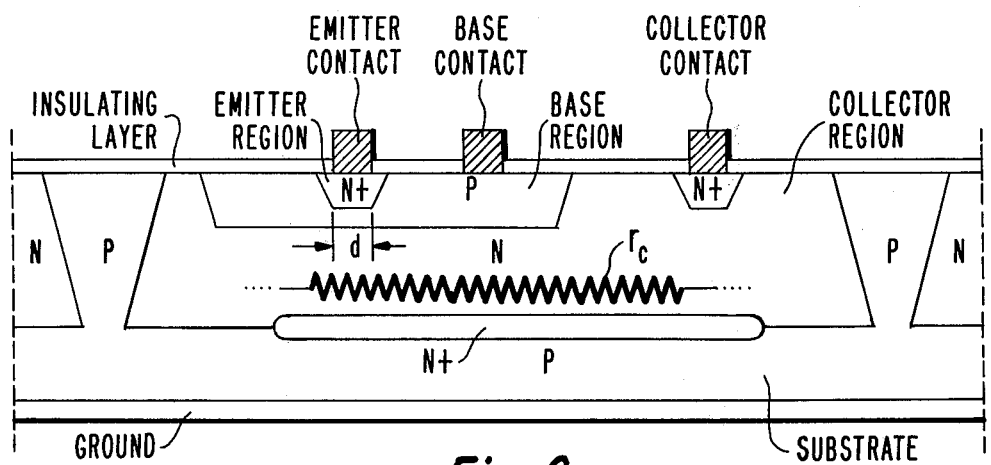
FIG. 6 illustrates a diagram helpful in understanding the operation of the circuits shown in FIGS. 2-5.

Reference is made to the diagram of FIG. 6 before proceeding with a further discussion of FIG. 2.

FIG. 6 depicts a cross-sectional view of a semiconductor transistor device such as may be employed for transistors 22 and 28 in FIG. 2. The device comprises a grounded substrate formed of P-type semiconductor material, a collector region comprising N-type material diffused over the substrate, a base region comprising P-type material defined into the collector N material, and an emitter region comprising N+ type material diffused into the emitter region. Conductive external contact terminals are associated with the base, emitter and collector regions, respectively. An insulating layer overlies the semiconductor material. A resistor $r_c$ is a symbolic representation of the distributed semiconductor resistance associated with the collector region.

Considering FIG. 6 together with FIG. 2, it is noted that signal transistor 22 is susceptible of being damaged or destroyed in the presence of large amplitude, negative polarity transient voltages such as can be induced at input terminal $T_i$ due to kinescope arcing. Such negative transients (often in excess of one hundred volts peak-to-peak amplitude) when exceeding the reverse emitter-base breakdown voltage of transistor 22 are likely to destroy the emitter-base junction of transistor 22 due to excess short-term junction power dissipation. Specifically, transistor 22 conducts heavily in the reverse emitter to base direction in response to the large negative transients in proportion to the amount by which the transients exceed the reverse emitter-base breakdown voltage of approximately seven volts. Referring to FIG. 6, in this example high density reverse emitter to base current conduction with consequent intense heating occurs primarily in area "d" of the emitter-base junction, with thermal destruction of this junction at this point being a likely occurrence if protective measures are not employed. Base bias resistor 24 can also be destroyed when transistor 22 and resistor 24 are formed in the same integrated circuit, since small area integrated circuit resistors typically cannot rapidly dissipate a large amount of thermal energy such as may be caused by large transient induced currents.

Destruction of signal transistor 22 by large negative transients is prevented by protection transistor 28. The main current conducting path (collector-emitter path) of transistor 28 is directly connected between a source of positive D.C. supply potential $+V_{cc}$ and input terminal $T_i$ without intervening elements in this example (recall that resistor 29 is a symbolic representation of distributed collector region resistance shown as resistance $r_c$ in FIG. 6). A reference voltage of predetermined magnitude serves to reverse bias the collector-base junction of transistor 28, and biases the base electrode of protection transistor 28 to establish a desired threshold conduction level of transistor 28.

When the bias reference voltage applied to transistor 28 corresponds to ground potential (zero volts) for example, transistor 28 will conduct when the emitter voltage of transistor 28 is substantially equal to or less than the sum of the bias reference voltage plus the base-emitter junction offset voltage of transistor 28 (approximately 0.7 volts). Accordingly, a negative transient voltage appearing at terminal $T_i$ with a magnitude exceeding $-0.7$ volts will cause transistor 28 to conduct. Transistor 28 when conducting provides a current path for diverting currents associated with the transient away from signal transistor 22. Current in this path flows from the source of operating potential $+V_{cc}$, through the collector-emitter path of transistor 28 and terminal $T_i$, to the source of transient voltage. This manner of conducting current from the source of operating supply voltage is advantageously in an integrated circuit environment since it minimizes the likelihood of disruptive transient effects being developed in other areas of the integrated circuit via the common substrate material.

In this example, transistor 28 is biased to conduct before the reverse emitter-base junction breakdown voltage (approximately 7 volts) of signal transistor 22 is reached. Since reverse emitter-base current does not flow in signal transistor 22 until the reverse breakdown voltage is reached, signal transistor 22 does not conduct transient induced currents when protection transistor 28 is conducting. Note that when protection transistor 28 conducts, the voltage at terminal $T_i$ and therefore the base voltage of signal transistor 22 are effectively clamped to a voltage level equal to the magnitude of the base bias reference voltage of transistor 28, less the base-emitter junction offset voltage of transistor 28. The level of the bias reference voltage applied to transistor 28 can be tailored to suit the requirements of a particular system, consistent with enabling the operation of the protection transistor before damaging levels of reverse current are produced in signal transistor 22.

The protection circuit of FIG. 2 exhibits several advantageous features.

The protection circuit includes a minimum number of components, since only a single transistor is required. This transistor need not be a large or high power device, and can be the same type as small signal transistor 22. Thus the protection circuit is advantageously used in an integrated circuit with limited available area. In this regard, it is noted that protection transistor 28 inherently exhibits self-limited transient current conduction when conducting in saturated and non-saturated states in response to the high voltage transients. Such inherently limited transient current conduction is attributable to the distributed collector resistance of transistor 28 (resistance $r_c$ in FIG. 6), and permits use of a protection transistor with a conventional emitter-base area configuration. A separate current limiting collector resistor could also be employed if needed, however.

In addition, it is noted that the base bias reference voltage which determines the threshold conduction level of protection transistor 28 is applied to the protection circuit apart from the protected circuit, and in this example can be determined separately from the (base) bias of protected transistor 22. Therefore, the level of the threshold reference voltage of protection transistor 28 can be determined independently of the bias requirements of the circuit to be protected.

It is also noted that protection circuit 25 does not alter the high frequency (input) response characteristic of signal circuit 20, and also does not alter the input impedance of signal circuit 20 for signal processing purposes. Protection circuit 25 is arranged so that a desirably high impedance is presented to terminal $T_i$ and to the protected circuit under normal conditions when protection transistor 28 is not conductive. This impedance comprises the impedance associated with the reverse biased base-emitter junction of transistor 28 including the very small parasitic emitter capacitance of transistor 28 (i.e., compared with the much greater parasitic collector capacitance). The protection circuit does not introduce an additional impedance between terminal $T_i$ and circuit 20. Thus the disclosed protection circuit does not introduce an impedance that would alter the impedance otherwise associated with the input of circuit 20, nor does the protection circuit introduce an impedance capable of forming a low pass filter together with the parasitic capacitance that may be (and typically is) associated with terminal $T_i$.

Figure 3:
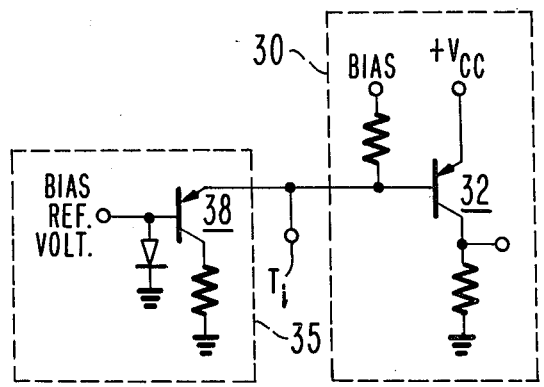
Figure 4:
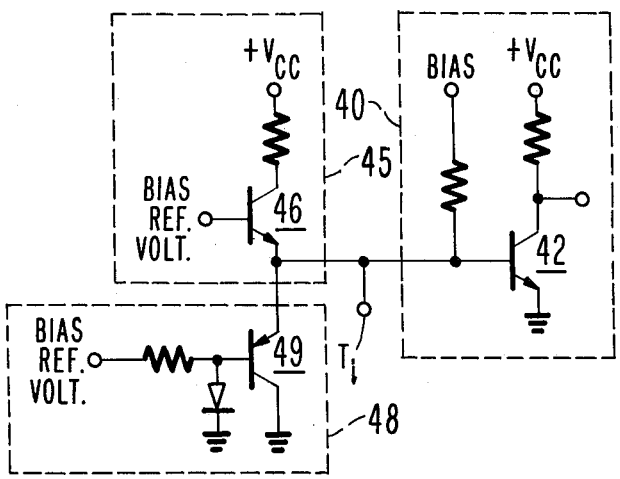
Figure 5:
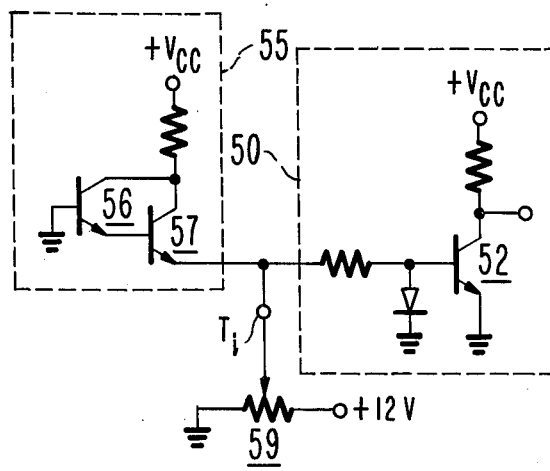

Observations concerning the operation and features of the arrangement shown in FIG. 2 also apply in substance to the alternative embodiments shown in FIGS. 3, 4 and 5.

FIG. 3 shows an arrangement of a PNP signal amplifier transistor 32 included in a signal processing network 30, and a PNP protection transistor 38 included in a protection circuit 35. This arrangement serves to protect PNP signal transistor 32 from reverse emitter-base junction breakdown damage in the presence of large positive transient voltages that appear at terminal $T_i$ with a magnitude capable of causing such reverse conduction breakdown.

FIG. 4 shows an arrangement of a signal processing network 40 including an NPN signal transistor 42 that is protected against damage due to both negative and positive high voltage transients. For this purpose, the arrangement of FIG. 4 includes a first protection circuit 45 including an NPN protection transistor 46 for protecting signal transistor 42 from amage due to large negative transient voltages, and a second protection circuit 48 including a PNP protection transistor 49 for protecting signal transistor 42 from damage due to large positive transient voltages. Protection circuits 45 and 48 respectively correspond to protection circuits 25 and 35 in FIGS. 2 and 3.

FIG. 5 discloses an arrangement wherein a wiper of a potentiometer 59 (e.g., an adjustable gain control potentiometer) is connected to terminal $T_i$ for controlling the gain of an NPN transistor 52 in a signal processing circuit 50. In this arrangement, the potentiometer wiper voltage is desired to be adjustable substantially over the entire range of operating voltage applied to the potentiometer, or between zerio volts (ground potential) and +12 volts. A control arrangement of this type or an equivalent arrangement is often associated with signal processing circuits of a televison receiver.

In this instance, a protection circuit 55 including NPN transistors 56 and 57 is associated with circuit 50 and terminal $T_i$. The base-emitter junction of transistor 56, 57 are coupled in series between a bias reference potential of zero volts (ground potential) and terminal $T_i$. The collectors of transistors 56, 57 are interconnected and coupled to an operating supply voltage $+V_{cc}$.

The arrangement of protection circuit 55 permits the desired range of control voltage from potentiometer 59 (zero volts to +12 volts) to be developed at terminal $T_i$, unimpeded by the protection circuit. In this regard, it is noted that each of transistors 56, 57 exhibits a reverse emitter-base breakdown voltage of approximately seven volts, so that the combined reverse breakdown voltage for the combination of devices 56 and 57 is approximately fourteen volts. Therefore, under normal operation conditions (i.e., in the absence of transients), transistor 57 and 57 will not exhibit reverse conduction since the combined reverse breakdown voltage will not be exceeded when the wiper of potentiometer 59 exhibits the (maximum) positive control potential of +12 volts.

The described protection circuits are suitable for protecting any semiconductor junction device (e.g., including transistors, diodes, and resistors particularly in an integrated circuit) having a relatively small area configuration incapable of safely dissipating or limiting large amounts of energy such as can be caused by high voltage transients. In addition, the described protection circuits can be utilized to protect both input and output circuit points and terminals.

What is claimed is:

1. An arrangement for protecting a semiconductor device from electrical stress damage due to spurious high voltage transients, said semiconductor device comprising a semiconductor junction coupled to a circuit point at which said transients may appear and susceptible of damage from electrical stress when said transients exceed a given level, said protecting arrangement comprising:

a protection transistor with a collector electrode coupled to an operating potential, a base electrode, and an emitter electrode coupled to said circuit point; and means for applying a reference bias voltage to said base electrode in such manner that the bias of said base electrode is determinable independent of bias of said semiconductor device and bias at said circuit point, said reference bias voltage being operative to reverse bias the collector-base junction of said protection transistor and to provide reverse biasing of the base-emitter junction of said protection transistor in the absence of said transients so as to render said protection transistor normally nonconductive, the level of said reference bias voltage being such that the base-emitter junction of said protection transistor is forward biased in response to transients exceeding a threshold level below said given level to permit conduction in the emitter-collector path of said protection transistor to divert transient currents away from said semiconductor device.

2. An arrangement for protecting a semiconductor device from electrical stress damage due to spurious high voltage transients, said semiconductor device comprising a semiconductor junction coupled to a circuit point at which said transients may appear and susceptible of damage from electrical stress when said transients exceed a given level, said protecting arrangement comprising:
  a protection transistor with a collector electrode coupled to an operating potential, a base electrode, and an emitter electrode coupled to said circuit point;
  means for applying a reference bias voltage to said base electrode for reverse biasing the collector-base junction of said protection transistor, and to provide reverse biasing of the base-emitter junction of said protection transistor in the absence of said transients so as to render said protection transistor normally nonconductive, the level of said reference bias voltage being such that the base-emitter junction of said protection transistor is forward biased in response to transients exceeding a threshold level below said given level to permit conduction in the emitter-collector path of said protection transistor to divert transient currents away from said semiconductor device; and wherein
  said emitter of said protection transistor is connected to said semiconductor device with substantially zero offset voltage between said circuit point and said semiconductor device.

3. An arrangement for protecting a semiconductor device from electrical stress damage due to spurious high voltage transients, said semiconductor device comprising a semiconductor junction coupled to a circuit point at which said transients may appear and susceptible of damage from electrical stress when said transients exceed a given level, said protecting arrangement comprising:
  a protection transistor with a collector electrode coupled to an operating potential, a base electrode, and an emitter electrode coupled to said circuit point;
  means for applying a reference bias voltage to said base electrode in such manner that the bias of said base electrode is determinable independent of bias of said semiconductor device and bias at said circuit point, said reference bias voltage being operative to reverse bias the collector-base junction of said protection transistor and to provide reverse biasing of the base-emitter junction of said protection transistor in the absence of said transients so as to render said protection transistor normally conductive, the level of said reference bias voltage being such that the base-emitter junction of said protection transistor is forward biased in response to transients exceeding a threshold level below said given level to permit conduction in the emitter-collector path of said protection transistor to divert transient currents away from said semiconductor device; and wherein
  said emitter of said protection transistor is connected to said semiconductor device with substantially zero offset voltage between said circuit point and said semiconductor device.

4. An arrangement according to claim 3, wherein:
  said semiconductor device comprises a transistor device having an input first electrode coupled to said circuit point and second and third electrodes defining a main current conduction path of said transistor device; and
  said protection transistor is biased to conduct in response to transients to prevent said transistor device from conducting excessive reverse input currents.

5. An arrangement according to claim 4, wherein:
  said transistor device includes a base input electrode, and collector and emitter electrodes defining said main current conduction path; and
  said protection transistor is biased to conduct in response to transients to prevent said transistor device from conducting excessive emitter-base junction currents.

6. An arrangement according to claim 4, wherein:
  said protection transistor and said transistor device are similar devices of the same conductivity type.

7. An arrangement according to claims 3, 4, 5 or 6, wherein:
  the level of current conducted by said protection transistor in response to transients is primarily determined by the distributed collector region resistance of said protection transistor.

8. In a television receiver including an image reproducing kinescope; a source of operating supply voltage including high voltage for said kinescope; a video signal processing circuit comprising a semiconductor device including a semiconductor junction coupled to a circuit point at which high voltage transients caused by kinescope arcing may appear, said semiconductor junction being susceptible of damage from electrical stress when said transients exceed a given level; a protection circuit arrangement comprising:
  a protection transistor with a collector electrode coupled to an operating potential, a base electrode, and an emitter electrode connected to said circuit point; and
  means for applying a reference bias voltage to said base electrode in such manner that the bias of said base electrode is determinable independent of bias of said semiconductor device and bias at said circuit point, said reference bias boltage being operative to reverse bias the collector-base junction of said protection transistor and to provide reverse biasing of the base-emitter junction of said protection transistor in the absence of said transients so as to render said protection transistor normally nonconductive, the level of said reference bias voltage being such that the base-emitter junction of said protection transistor is forward biased in response to transients exceeding a threshold level below said given level to permit conduction in the emitter-collector path of said protection transistor to divert transient currents away from said semiconductor device.

9. An arrangement according to claim 8, wherein:
said emitter of said protection transistor is connected to said semiconductor device with substantially zero offset voltage between said circuit point and said semiconductor device.

10. An arrangement according to claim 8 or 9, and further comprising:
an adjustable voltage divider coupled between first and second points of operating potential, said voltage divider including an adjustable tap coupled to said circuit point; and means for biasing said protection transistor so that said protection transistor remainsnonconductive in the absence of transients as said voltage divider is adjusted between minimum and maximum extremes.

11. An arrangement according to claim 10, wherein:
said biasing means includes a transistor with a base electrode coupled to said reference bias voltage, a collector electrode coupled to an operating potential, and a base-emitter junction arranged in series with the base-emitter junction of said protection transistor between said reference bias voltage and said circuit point.

* * * * *